(12) United States Patent
Yamano (10) Patent No.: US 11,018,655 B2
(45) Date of Patent: May 25, 2021

(54) LEVEL SHIFT CIRCUIT AND DISPLAY DRIVER INTEGRATED CIRCUIT

(71) Applicant: SHENZHEN TOREY MICROELECTRONIC TECHNOLOGY CO. LTD., Shenzhen (CN)

(72) Inventor: Kaname Yamano, Sakai (JP)

(73) Assignee: SHENZHEN TOREY MICROELECTRONIC TECHNOLOGY CO. LTD., Shenzhen (CN)

( * ) Notice: Subject to any disclaimer, the term of this patent is extended or adjusted under 35 U.S.C. 154(b) by 0 days.

(21) Appl. No.: 16/202,025

(22) Filed: Nov. 27, 2018

(65) Prior Publication Data

US 2019/0165770 A1    May 30, 2019

(30) Foreign Application Priority Data

Nov. 28, 2017   (JP) .............................. JP2017-228286

(51) Int. Cl.
| | | |
|---|---|---|
| *H03K 3/356* | (2006.01) | |
| *H03K 19/0185* | (2006.01) | |
| *G09G 3/3291* | (2016.01) | |
| *G09G 3/3266* | (2016.01) | |
| *G09G 3/20* | (2006.01) | |

(52) U.S. Cl.
CPC ......... *H03K 3/356113* (2013.01); *G09G 3/20* (2013.01); *G09G 3/3266* (2013.01); *G09G 3/3291* (2013.01); *H03K 19/018521* (2013.01); *G09G 2310/0289* (2013.01); *G09G 2310/0291* (2013.01)

(58) Field of Classification Search
None
See application file for complete search history.

(56) References Cited

U.S. PATENT DOCUMENTS

| | | | | |
|---|---|---|---|---|
| 6,069,605 A | * | 5/2000 | Ozawa ................. | G09G 3/3614 345/98 |
| 2007/0002509 A1 | * | 1/2007 | Kumagai ............. | G09G 3/3688 361/56 |
| 2011/0181573 A1 | * | 7/2011 | Lee ...................... | G09G 3/3611 345/211 |

FOREIGN PATENT DOCUMENTS

| | | | | | |
|---|---|---|---|---|---|
| AU | 2012220887 A1 | * | 9/2013 | ........... | H03K 17/164 |
| CN | 102136257 A | * | 7/2011 | ........... | G09G 3/3611 |
| JP | H07-161821 A | | 6/1995 | | |
| JP | 2006276641 A | * | 10/2006 | ............... | G09G 3/20 |
| KR | 20060088509 A | * | 8/2006 | ........... | G09G 3/3677 |

OTHER PUBLICATIONS

L. Abbatelli, C. Brusca, G. Catalisano. "AN4671 Application note: How to fine tune your SiC MOSFET gate driver to minimize losses" Apr. 2015.

* cited by examiner

*Primary Examiner* — Parul H Gupta
(74) *Attorney, Agent, or Firm* — ScienBiziP, P.C.

(57) ABSTRACT

A level shift block of a level shift circuit includes a level shifter by which an amplitude level of a signal to drive a P-type transistor is extended to a negative side, and a level shifter by which an amplitude level of a signal to drive an N-type transistor is extended to a positive side.

9 Claims, 7 Drawing Sheets

LEVEL SHIFT CIRCUIT AND DISPLAY DRIVER INTEGRATED CIRCUIT

BACKGROUND

1. Field

The present disclosure relates to a level shift circuit that shifts a level of a logic signal to that of an input/output signal and a display driver integrated circuit that uses the level shift circuit, and particularly relates to a level shift circuit used for a display driver integrated circuit that requires multiple power sources.

2. Description of the Related Art

An operation voltage of a semiconductor element that performs calculation or storage is lowered due to power consumption reduction or a high-speed operation. However, a high voltage is generally used for driving a display element.

A display driver integrated circuit that drives a display element requires a power source for a grayscale voltage (e.g. 8 V), a power source for driving a transistor in a panel (e.g. 20 V or −10 V) in addition to a power source for controlling a logic signal (e.g. 1.1 V). There is also a case where an optimum transistor is required for a power source of an input/output system (e.g. 1.8 V) when another logic device of a display apparatus is connected.

In order to form transistors on the same semiconductor element, which optimally operate at different voltages, it is necessary to provide regions having impurity injecting conditions different from each other, and thereby a manufacturing process increases.

Thus, Japanese Unexamined Patent Application Publication No. 7-161821 (published on Jun. 23, 1995) describes a method of creating regions having a plurality of impurity concentrations without increasing the manufacturing process.

In a case where the manufacturing process is complicated, cost or delivery time is affected by an increase in the number of masks and required time from order reception to product supply (Turn Around Time, TAT). A transistor for an input/output system may be replaced with a transistor of a grayscale power source in view of breakdown voltage. Thus, there is a case where the transistor of the grayscale power source is configured for the input/output system and a transistor used exclusively for the input/output system is not configured.

In the case where the transistor used exclusively for the input/output system is not configured, a transistor used for the input/output system is required to be formed by using a process of the transistor of the grayscale power source in which breakdown voltage more than necessary is set.

Figure 6:
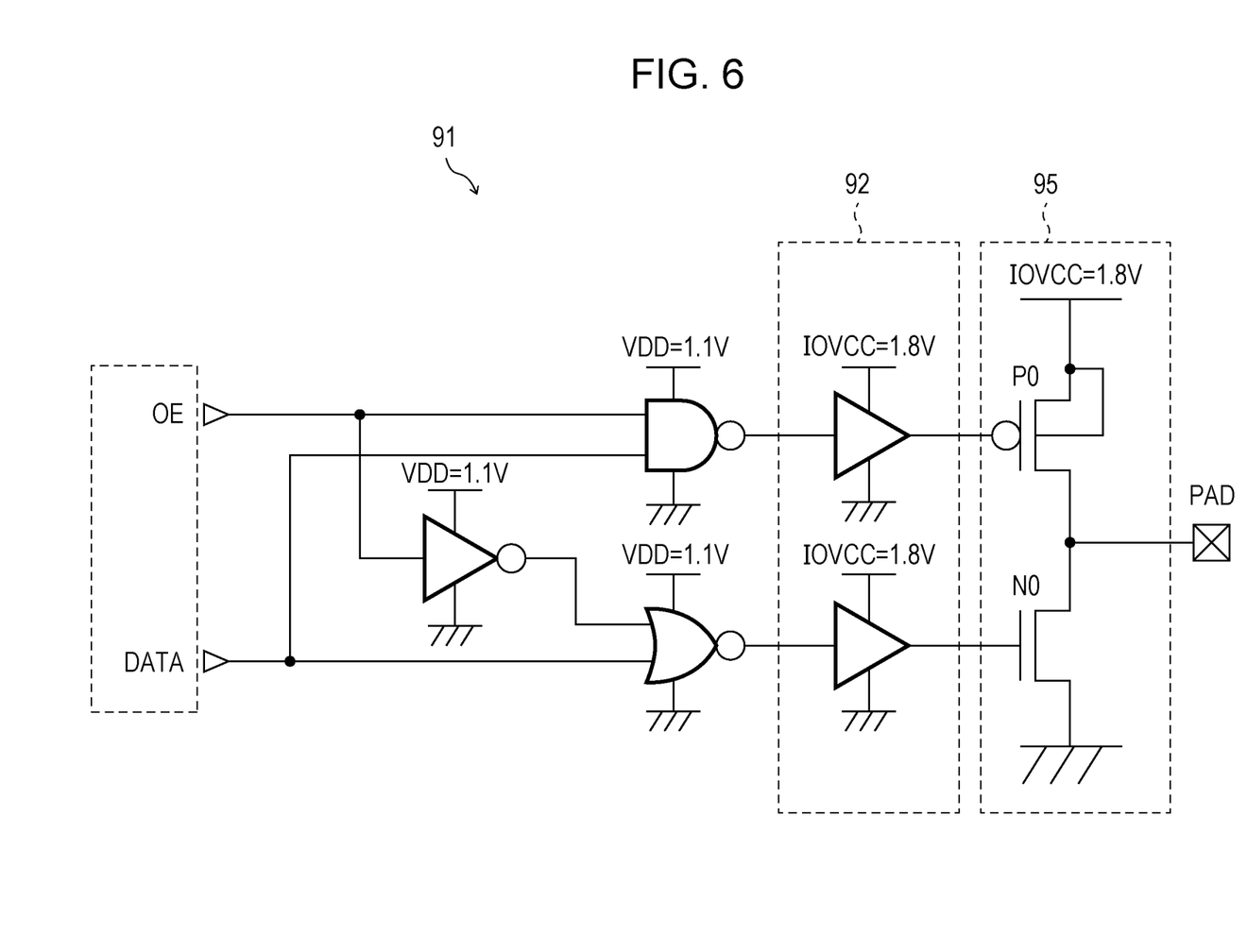
FIG. 6 is a circuit diagram of a level shift circuit of a related art.

FIG. 6 is a circuit diagram of a level shift circuit 91 of a related art, which includes an output buffer circuit 95 of an input/output system. FIG. 6 illustrates an example in which, when an output control signal OE is enabled, an output signal DATA is output to an outside.

Each of the output control signal OE and the output signal DATA is at a VDD-GND level (1.1 V) of a signal of a logic system. An inverter, a NAND, and a NOR of the level shift circuit 91 are formed in such a process that allows optimum operations with a power source of control logic (1.1 V). A level shift block 92 and a P-type transistor P0 and an N-type transistor N0 of the output buffer circuit 95 are required to convert the signal of the logic system (1.1 V) into a signal of an input/output system (1.8 V) and output the resultant, and thus are desired to be formed in such a process that allows optimum operations with the power source of the input/output system (1.8 V). However, there is no exclusive process, the level shift block 92, the P-type transistor P0, and the N-type transistor N0 are formed in the process of the grayscale power source (8 V) whose breakdown voltage is 1.8 V or more and whose optimum operation voltage is close.

In the level shift circuit 91, the output signal DATA of the signal of the logic system (1.1 V) is converted to the signal of the input/output system (1.8 V) by the level shift block 92 and the output buffer circuit 95 and output to the outside.

Figure 7:
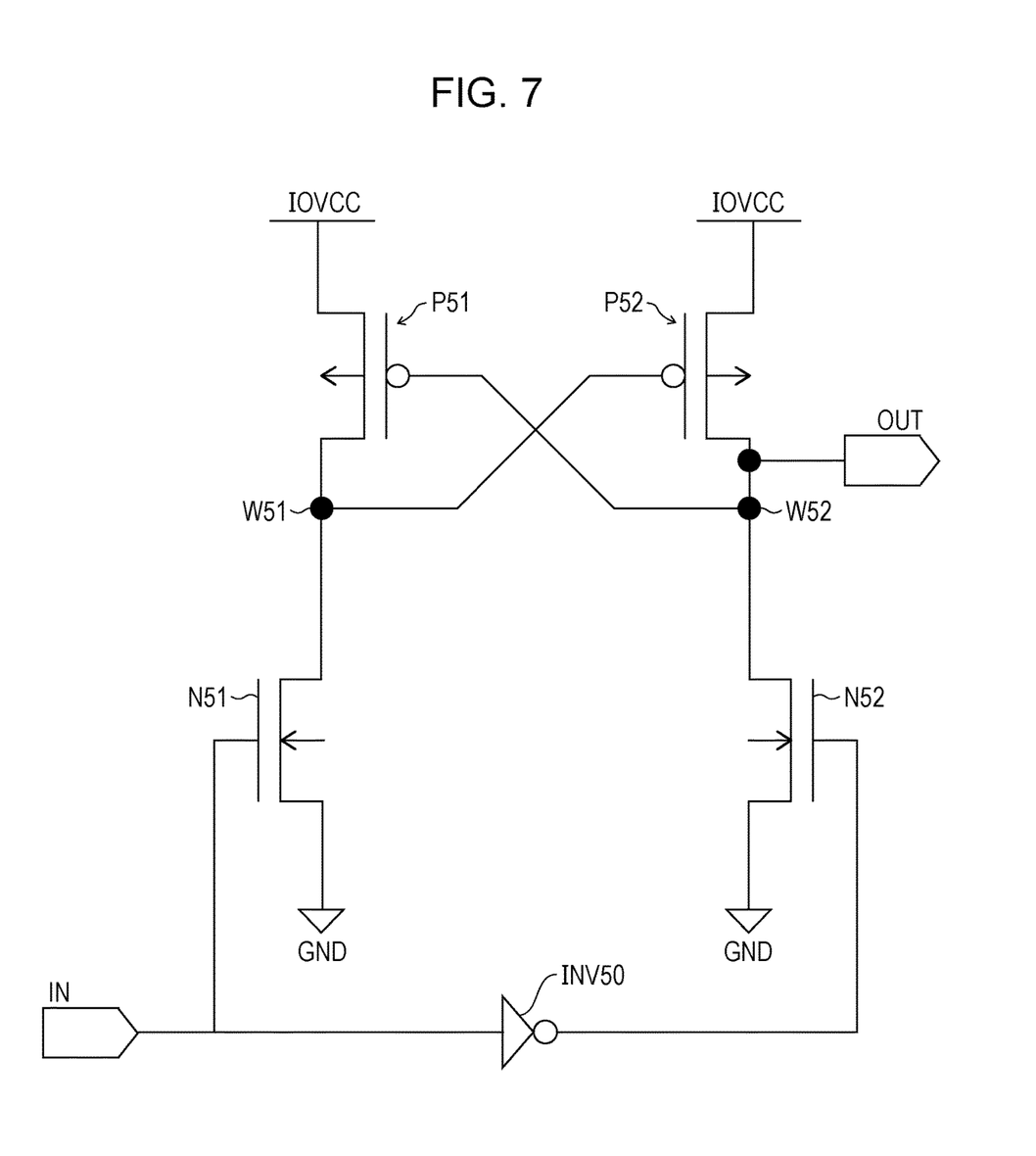
FIG. 7 is a circuit diagram of a level shifter of a related art.

FIG. 7 is a circuit diagram of a general level shifter of a related art. The level shifter includes two N-type transistors N51 and N52, two P-type transistors P51 and P52 of a cross-coupled type each of which has a gate connected to a drain of the other one, and an inverter INV50. The inverter INV50 inverts an input signal of an input terminal IN and operates by a low voltage source VDD (not illustrated) of 1.1 V. An element other than the inverter INV50 is an element on a high-voltage side, which operates by a high voltage source IOVCC of 1.8 V.

The two N-type transistors N51 and N52 have sources that are grounded and receive signals that are complementary to each other, that is, the input signal of the input terminal IN and an inversion signal of the input signal from the inverter INV50. The two P-type transistors P51 and P52 have sources that are connected to the high voltage source IOVCC, the gates each of which is connected to the drain of the other one in a cross-coupled manner, and the drains each of which is connected to a corresponding one of drains of the N-type transistors N51 and N52. A node W51 is set as a connection point of the P-type transistor P51 and the N-type transistor N51, and a node W52 is set as a connection point of the P-type transistor P52 and the N-type transistor N52. Moreover, an output terminal OUT is connected to the node W52.

Next, an operation of the level shifter will be described. In a steady state, for example, in a case where the input signal is at an H (VDD) level and the inversion signal thereof is at an L (GND=0 V) level, the N-type transistor N51 is ON, the N-type transistor N52 is OFF, the P-type transistor P51 is OFF, and the P-type transistor P52 is ON. The node W51 that is one of the nodes is at the L (GND) level and the node W52 that is the other one of the nodes is at an H (IOVCC) level. The N-type transistor N51 and the P-type transistor P51 and the N-type transistor N52 and the P-type transistor P52 are in a mutually complementary relationship, so that no current flows in the steady state.

After that, when the level of the input signal is changed to the L (GND) level and the state is shifted, the N-type transistor N51 is turned OFF and the N-type transistor N52 is turned ON. Accordingly, a through current flows from the high voltage source IOVCC to GND through the P-type transistor P52 and the N-type transistor N52 that are ON, and an electric potential of the node W52 begins to be lowered from the H (IOVCC) level. When the electric potential of the node W52 is lowered to IOVCC-Vtp (Vtp indicates a threshold voltage of the P-type transistor P52) or less, the P-type transistor P51 starts to be turned ON and an electric potential of the node W51 (electric potential of the gate of the P-type transistor P52) is raised, so that a drain current of the P-type transistor P52 is reduced and the electric potential of the node W52 is further lowered.

Finally, since the electric potential of the node W51 is at the H (IOVCC) level and the electric potential of the node W52 is at the L (GND) level, the through current is not caused to flow, so that output logic is inverted and the state is brought into a waiting state of change of a next input signal. As above, the case where the input signal is changed from the H (VDD) level to the L (GND) level has been described, and also in an opposite case, the level shifter operates similarly.

In the description of the aforementioned related art, the P-type transistor P51 starts to be turned ON when the electric potential of the node W52 is lowered to IOVCC-Vtp or less. However, since the level shifter illustrated in FIG. 7 is formed in the process of the grayscale power source (8 V), the threshold voltage Vtp is great, so that it takes time to lower the electric potential of the node W52 to IOVCC-Vtp or less. Thus, a switching speed of the level shifter is reduced. Since a similar case happens in other transistors, there is a problem that a larger transistor is required in order to ensure the switching speed. Similarly, also in an output buffer, a sufficient gate voltage that exceeds the threshold is difficult to be obtained, so that there is a problem that a larger transistor is required in order to realize specifications of a current supply ability.

An aspect of the disclosure provides a driving method capable of enhancing a driving ability without adding a process optimized exclusively for an output buffer, and a level shift circuit and a display driver integrated circuit that realize the driving method.

SUMMARY

In order to solve the aforementioned problem, a level shift circuit according to an aspect of the disclosure includes an output buffer circuit composed of a P-type transistor and an N-type transistor that output a signal, in which a level of a gate signal with which the P-type transistor is turned on is an electric potential lower than an electric potential of a negative-side power source of the output buffer circuit, and a level of a gate signal with which the N-type transistor is turned on is an electric potential higher than an electric potential of a positive-side power source of the output buffer circuit.

In order to solve the aforementioned problem, a level shift circuit according to another aspect of the disclosure includes: a level shift block by which a level of a logic signal is shifted; and an output buffer circuit including a P-type transistor and an N-type transistor that output an input/output signal, in which the level shift block includes a first level shifter by which an amplitude level of a signal to drive the P-type transistor is extended to a negative side and a second level shifter by which an amplitude level of a signal to drive the N-type transistor is extended to a positive side.

In order to solve the aforementioned problem, a display driver integrated circuit according to an aspect of the disclosure includes: the level shift circuit according to the disclosure; and a source drive circuit that drives a display apparatus based on a grayscale voltage generated by a grayscale voltage generating circuit.

DESCRIPTION OF THE EMBODIMENTS

Embodiment 1

Figure 1:
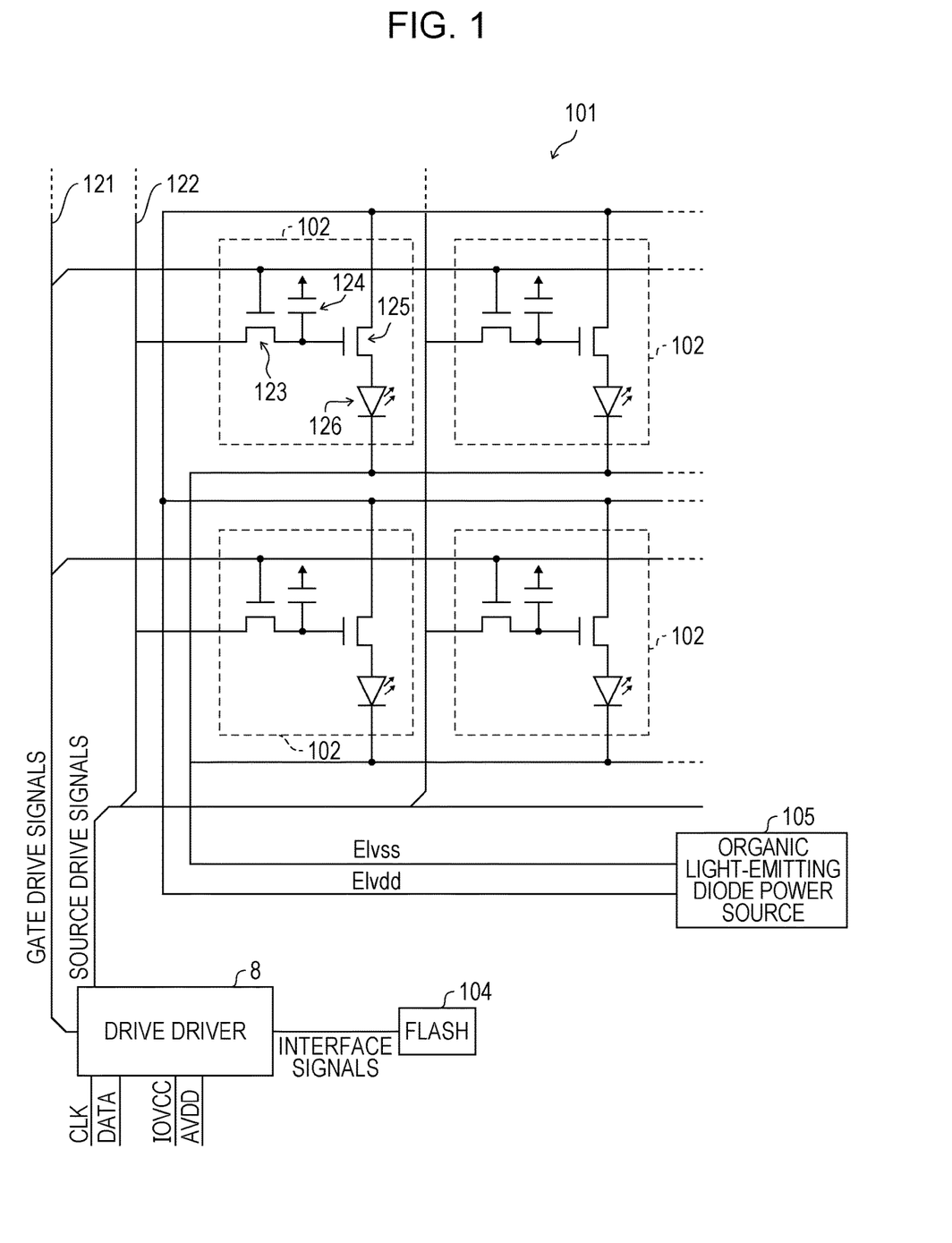
FIG. 1 is a block diagram of a display apparatus according to Embodiment 1.

Hereinafter, an embodiment of the disclosure will be described in detail. FIG. 1 is a block diagram illustrating a main part of a display apparatus 101 of an active-matrix organic EL display. The display apparatus 101 includes a plurality of pixels 102 that are formed in matrix, a drive driver 8, and a flash memory 104. Each of the pixels 102 is connected to a gate line 121 and a data line 122 and includes a first thin film transistor 123, a capacitor 124, a second thin film transistor 125, and an organic light-emitting diode (light-emitting element) 126.

The first thin film transistor 123 is composed of an N-type transistor. A gate of the first thin film transistor 123 is connected to the gate line 121. A drain of the first thin film transistor 123 is connected to the data line 122. The capacitor 124 is connected to a source of the first thin film transistor 123.

On the other hand, a second thin film transistor 125 is composed of a P-type transistor. A gate of the second thin film transistor 125 is connected to the source of the first thin film transistor 123 through the capacitor 124. An anode of the organic light-emitting diode 126 is connected to a drain of the second thin film transistor 125.

The gate line 121 is connected to a gate drive signal terminal of the drive driver 8, the data line 122 is connected to a source drive signal terminal of the drive driver 8, a source of the second thin film transistor 125 is connected to a terminal of a voltage Elvdd of an organic light-emitting diode power source 105, and a cathode of the organic light-emitting diode 126 is connected to a terminal of a voltage Elvss of the organic light-emitting diode power source 105.

Moreover, the drive driver 8 is connected with the flash memory 104, and supplied with a clock signal (synchronization signal) CLK, an output signal (display data) DATA, a high voltage source IOVCC, and a voltage AVDD from an outside.

Figure 2:
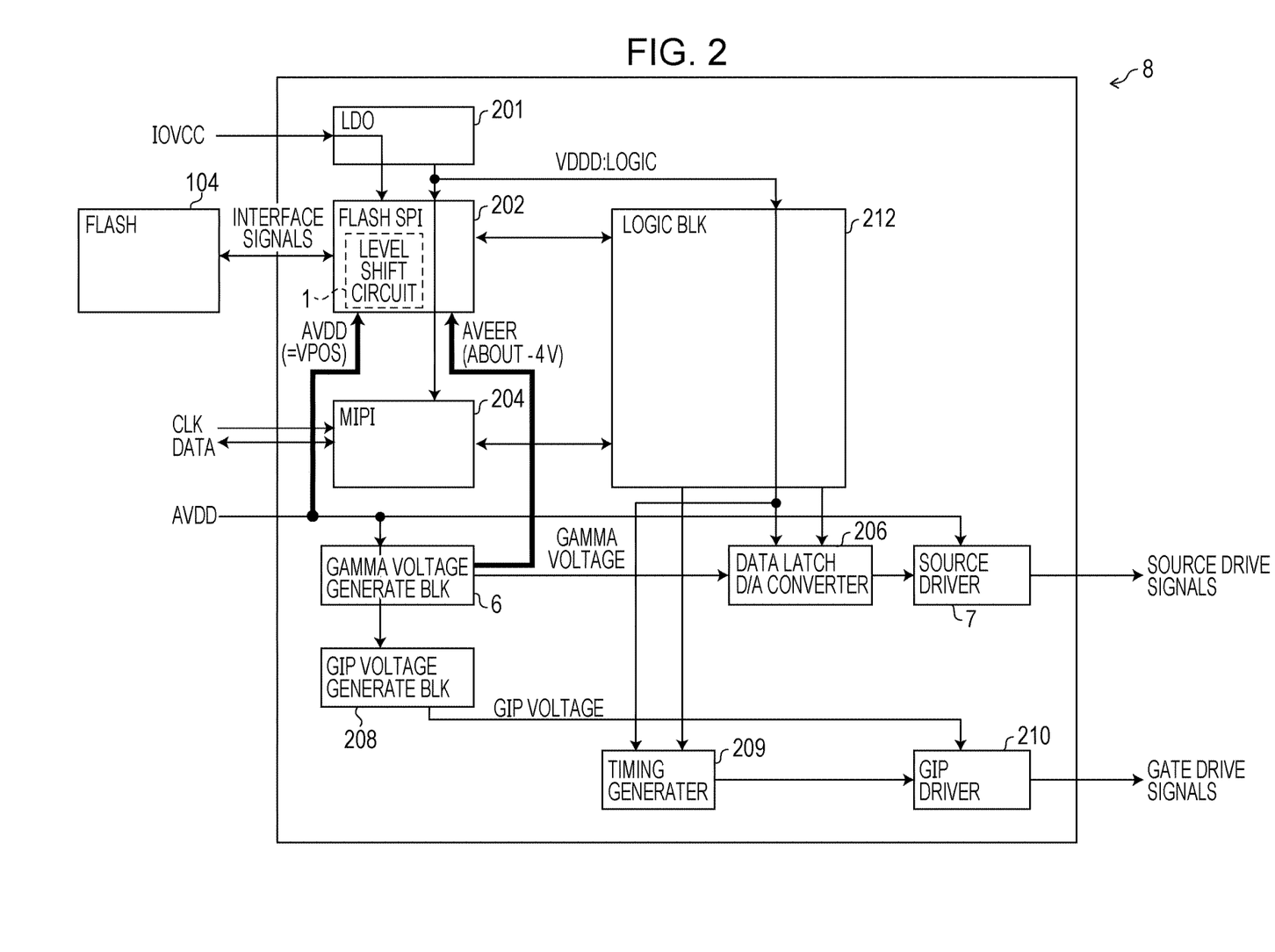
FIG. 2 is a block diagram of a drive driver provided in the display apparatus.

FIG. 2 is a block diagram of the drive driver 8. Note that, a described value of a voltage is an example, and the disclosure is not limited to such a value.

The high voltage source IOVCC and the voltage AVDD are supplied to the drive driver 8 from the outside. The high voltage source IOVCC is a power source of a control circuit system and a voltage of 1.8 V is applied therefrom. The voltage AVDD is a voltage of a power source of a display driving system and a voltage of 8 V is applied therefrom, for example.

A linear regulator (LDO) 201 converts a voltage from the high voltage source IOVCC to a logic operation voltage (VDDD) of 1.1 V in the drive driver 8.

A serial peripheral interface (SPI) (flash SPI) 202 is an interface with the connected flash memory 104. A level of signal (1.1 V) at a logic operation voltage (VDDD) level, which is produced by an internal logic of the drive driver 8, is shifted to a signal level (IOVCC, 1.8 V) of signals (Interface Signals) for accessing the flash memory 104, and the resultant signal is output by the serial peripheral interface 202. A level shift circuit 1 provided in the serial peripheral interface 202 will be described later.

A Mobile Industry Processor Interface (MIPI) 204 is an interface that receives the display data DATA and the synchronization signal CLK from an external image processing device.

A grayscale voltage generating circuit (gamma voltage generate blk) 6 is a block that generates a display voltage (gamma voltage) that corresponds to image data. The display voltage is generated in matching with gamma characteristics of a panel for display and is applied to the gate of the second thin film transistor 125 that controls a current flowing from the anode to the cathode of the organic light-emitting diode 126. A similar connection is performed also in the other pixels 102 illustrated in FIG. 1.

The anode of the organic light-emitting diode 126 is connected to the terminal of the voltage Elvdd, which is a terminal of a positive-side power source of the organic light-emitting diode power source 105, through the second thin film transistor 125, and the cathode is connected to the terminal of the voltage Elvss, which is a terminal of a negative-side power source. The terminal of the voltage Elvdd of the positive side and the terminal of the voltage Elvss of the negative side are connected commonly to the plurality of pixels 102. Since the voltage Elvdd and the voltage Elvss have no close relationship with the disclosure, detailed description thereof will be omitted here.

A data latch and D/A converter 206 outputs the voltage that matches the image data from among display voltages (gamma voltages) to a source drive circuit (source driver) 7.

The source drive circuit 7 includes a buffer by which the data line 122 is driven. A gate drivers in panel (GIP) voltage generation block (GIP voltage generate blk) 208 generates a GIP voltage. The GIP voltage is a voltage by which the first thin film transistor 123 is able to be turned on. A timing generator 209 generates a timing when the first thin film transistor 123 is turned on.

A GIP driver 210 includes a buffer by which the gate line 121 is driven.

A logic block (logic blk) 212 has no close relationship with the disclosure, and therefore detailed description thereof will be omitted.

In such a configuration, drive of each of the pixels 102 is performed as follows. First, the GIP voltage is applied to the gate of the first thin film transistor 123 through the GIP driver 210 and the gate line 121. Thereby, the first thin film transistor 123 is turned on. Next, a source drive signal is output from the source drive circuit 7 to the data line 122. The source drive signal is a gamma voltage that corresponds to the pixel 102 that is a target of display. A voltage of the data line 122 passes through the first thin film transistor 123 and is applied to the gate of the second thin film transistor 125 through the capacitor 124, and a current corresponding to a gate voltage flows in the second thin film transistor 125. Thereby, the current is supplied to the organic light-emitting diode 126 and the organic light-emitting diode 126 emits light with desired luminance.

Figure 3:
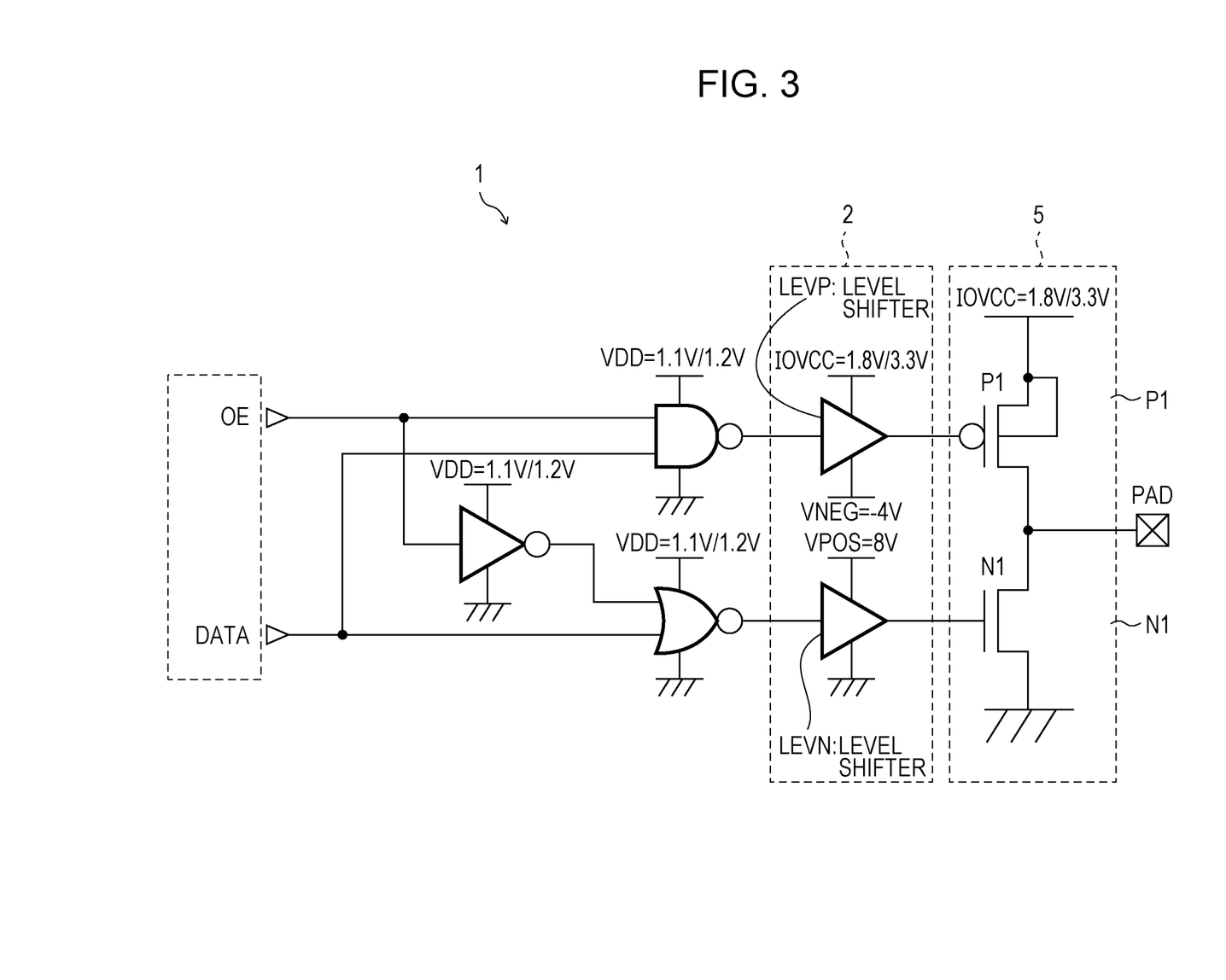
FIG. 3 is a circuit diagram of a level shift circuit that is provided in the drive driver.

Next, FIG. 3 illustrates the level shift circuit 1 provided in the serial peripheral interface 202.

The level shift circuit 1 has a configuration similar to that of the level shift circuit 91 described in the description of the related art with reference to FIG. 6, but configurations of level shift blocks are different from each other, and a power source of a low-voltage side of a level shifter LEVP (first level shifter) that drives a P-type transistor P1 of an output buffer circuit 5 is set as a low voltage source VNEG (−4 V) and a power source of a high-voltage side of a level shifter LEVN (second level shifter) that drives an N-type transistor N1 of the output buffer circuit 5 is set as a high voltage source VPOS (+8 V).

Figure 4:
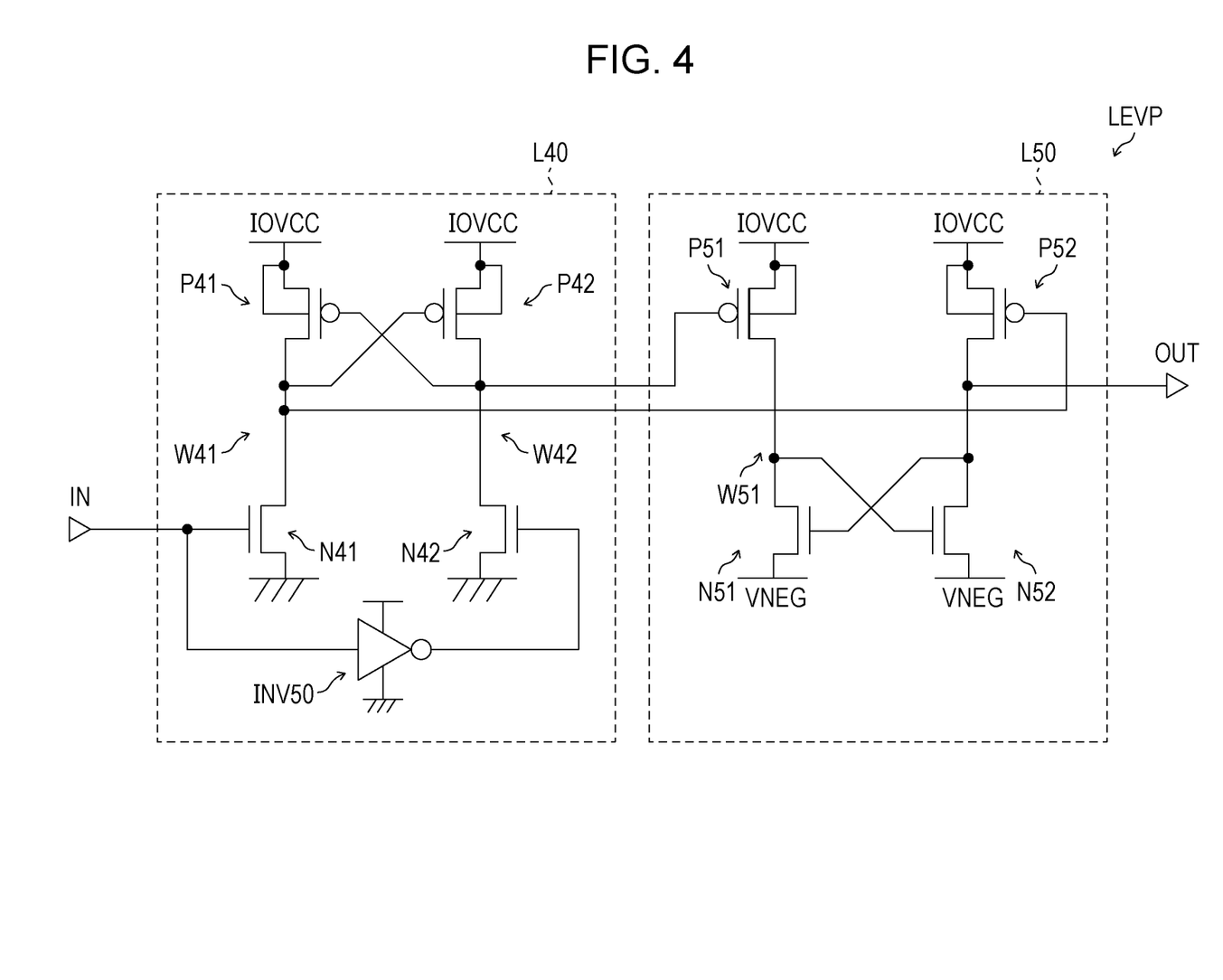
FIG. 4 is a circuit diagram of a first level shifter that is provided in the level shift circuit.

An operation of the level shifter LEVP will be described with reference to FIG. 4.

The level shifter LEVP includes a shifter circuit L40 that extends an amplitude of a signal of a logic system (1.1 V) to that of a power source voltage (1.8 V) of a high voltage source IOVCC system, and a shifter circuit L50 that converts an output signal (1.8 V) of the high voltage source IOVCC system of the shifter circuit L40 to a signal that has an amplitude between the power source voltage of the high voltage source IOVCC system and the low voltage source VNEG (−4 V).

Since the level shifter LEVP aims to speed up a turn-on operation of the P-type transistor P1 of the output buffer circuit 5, a case where a level of an input signal IN is changed from an H level (1.1 V) to an L (GND) level will be described.

In a steady state, in a case where the input signal IN is at the H level, an N-type transistor N42 of the sifter circuit L40 is OFF and an N-type transistor N41 is ON. At this time, a node W41 is at the GND level, so that a P-type transistor P42 is ON and a node W42 is at a high voltage source IOVCC level.

At this time, a P-type transistor P52 to which the node W41 is connected is ON and an output node OUT of the shifter circuit L50 is at the high voltage source IOVCC level.

Moreover, an N-type transistor N51 to which the output node OUT is connected is ON, so that a node W51 is turned into a low voltage source VNEG (−4 V) level, resulting in that an N-type transistor N52 is turned OFF. Additionally, a P-type transistor P51 to which the node W42 at the high voltage source IOVCC level is connected is OFF.

When the level of the input signal IN is shifted from the H level in the steady state to the L level, the N-type transistor N41 of the shifter circuit L40 is turned OFF and the N-type transistor N42 is turned ON. At this time, the node W42 that is connected to the N-type transistor N42 is at the GND level, so that the P-type transistor P41 is turned ON and the node W41 is turned into the high voltage source IOVCC level, resulting in that the P-type transistor P42 is turned OFF.

Further, since the P-type transistor P51 of the shifter circuit L50 to which the node W41 and the node W42 are connected is turned ON, the node W51 that is connected is turned into the high voltage source IOVCC level. Thus, the N-type transistor N52 that is connected to the node W51 is turned ON, so that the output node OUT of the shifter circuit L50 is turned into the low voltage source VNEG (−4 V) level. On the other hand, the N-type transistor N51 that is connected to the output node OUT is OFF, so that the P-type transistor P52 that is connected to the node W41 at the high voltage source IOVCC level is also OFF.

The output node OUT is connected to the P-type transistor P1, which is illustrated in FIG. 3 and whose source potential is connected to the high voltage source IOVCC, so that a gate voltage is turned into the low voltage source VNEG (−4 V) level at a time of the turn-on operation. Thus, a sufficient gate-to-source voltage is able to be ensured. Accordingly, a more drive current is allowed to flow in the P-type transistor P1 and it is possible to ensure a drive ability of specifications without enlarging a transistor size of the output buffer circuit 5. Here, the low voltage source VNEG has been described as −4 V as an example, but the disclosure is not limited thereto, needless to say, as long as a difference between the high voltage source IOVCC level and the low voltage source VNEG level of a level shift block 2 does not exceed breakdown voltage of the P-type transistor P1.

Figure 5:
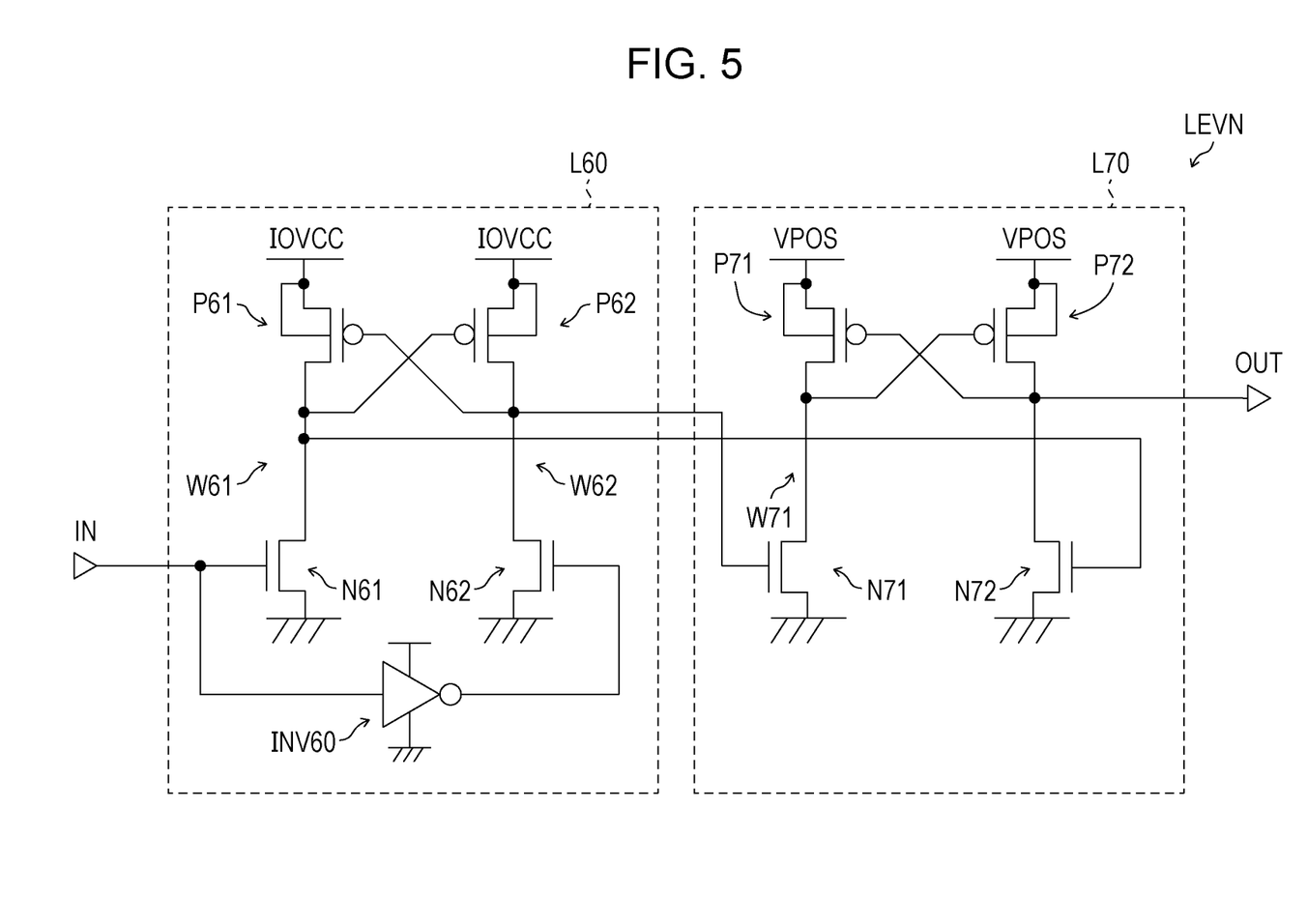
FIG. 5 is a circuit diagram of a second level shifter that is provided in the level shift circuit.

An operation of the level shifter LEVN will be described with reference to FIG. 5.

The level shifter LEVN includes a shifter circuit L60 that extends an amplitude of a signal (1.1 V) of a logic system to that of a power source voltage (1.8 V) of a high voltage source IOVCC system, and a shifter circuit L70 that converts an output signal (1.8 V) of the high voltage source IOVCC system of the shifter circuit L60 to a signal that has an amplitude between a high voltage source VPOS (+8 V) and the GND.

Since the level shifter LEVN aims to speed up a turn-on operation of the N-type transistor N1 of the output buffer circuit 5, a case where a level of an input signal IN is changed from the L (GND) level to the H level (1.1 V) will be described.

In a steady state, in a case where the input signal IN is at the L level, an N-type transistor N61 of the sifter circuit L60 is OFF and an N-type transistor N62 is ON. At this time, a node W62 is at the GND level, so that a P-type transistor P61 is ON and a node W61 is at the high voltage source IOVCC level.

At this time, an N-type transistor N72 to which the node W61 is connected is ON and an output node OUT of the shifter circuit L70 is at the GND level.

Moreover, a P-type transistor P71 to which the output node OUT is connected is ON, so that a node W71 is turned into the high voltage source IOVCC (1.8 V) level, resulting in that a P-type transistor P72 is turned OFF. Additionally, an N-type transistor N71 to which the node W71 at the high voltage source IOVCC level is connected is OFF.

When the level of the input signal IN is shifted from the L level in the steady state to the H level, the N-type transistor N62 of the shifter circuit L60 is turned OFF and the N-type transistor N61 is turned ON. At this time, the node W61 that is connected to the N-type transistor N61 is at the GND level, so that a P-type transistor P62 is turned ON and the node W62 is turned into the high voltage source IOVCC level, resulting in that the P-type transistor P61 is turned OFF.

Further, the N-type transistor N71 of the shifter circuit L70 to which the node W61 and the node W62 are connected is turned ON, the node W71 that is connected is turned into the GND level. Thus, the P-type transistor P72 that is connected to the node W71 is turned ON, so that the output node OUT of the shifter circuit L70 is turned into the high voltage source VPOS (+8 V) level. On the other hand, the P-type transistor P71 to which the output node OUT is connected is OFF, so that the N-type transistor N71 that is connected to the node W71 at the GND level is also OFF.

The output node OUT is connected to the N-type transistor N1 which is illustrated in FIG. 3 and whose source potential is connected to the GND, so that a gate voltage of the N-type transistor N1 is turned into the high voltage source VPOS (+8 V) level at a time of the turn-on operation. Thus, a sufficient gate-to-source voltage of the N-type transistor N1 is able to be ensured. Accordingly, a more drive current is allowed to flow in the N-type transistor N1 and it is possible to ensure a drive ability of specifications to drive the output buffer circuit 5, without enlarging the transistor size of the output buffer circuit 5.

Here, a voltage of the high voltage source VPOS has been described as +8 V as an example, but the disclosure is not limited thereto, needleless to say, as long as a difference between the high voltage source VPOS level and the GND level of the level shifter LEVN does not exceed breakdown voltage of the N-type transistor N1.

As illustrated in the block diagram of FIG. 2, the high voltage source VPOS (+8 V) is generated by using the voltage AVDD that is supplied from the outside.

As illustrated in the block diagram of FIG. 2, the low voltage source VNEG is generated by using a voltage AVEER (−4 V) that is selected from among display voltages (gamma voltages) generated by the grayscale voltage generating circuit (gamma voltage generate blk) 6.

Thus, the level shift circuit 1 according to the present embodiment requires no additional power source. The level shift circuit 1 is configured by using the voltages (the voltage AVDD, the voltage AVEER) necessary for the display apparatus 101, so that it is possible to minimize influence on a chip area without increasing a size of a circuit for an additional power source. Additionally, the level shift circuit 1 is able to be formed by an existing manufacturing process of a device, by which a display apparatus is driven, without preparing a transistor optimum for performing input and output, so that there is no influence on a manufacturing TAT, which is caused by adding a manufacturing process.

In this manner, the level shift circuit 1 of the present embodiment is able to enhance a driving ability without adding a process optimized exclusively for the output buffer circuit 5, and to remarkably shorten communication time with the flash memory 104 connected to the drive driver 8 that drives the display apparatus 101.

CONCLUSION

The level shift circuit 1 according to an aspect 1 of the disclosure includes the output buffer circuit 5 composed of the P-type transistor P1 and the N-type transistor N1 that output a signal, in which a level of a gate signal with which the P-type transistor P1 is turned on is an electric potential lower than an electric potential of a negative-side power source of the output buffer circuit 5, and a level of a gate signal with which the N-type transistor N1 is turned on is an electric potential higher than an electric potential of a positive-side power source of the output buffer circuit 5.

The level shift circuit 1 according to an aspect 2 of the disclosure includes: the level shift block 2 by which a level of a logic signal is shifted; and the output buffer circuit 5 including the P-type transistor P1 and the N-type transistor N1 that output an input/output signal, in which the level shift block 2 includes a first level shifter (level shifter LEVP) by which an amplitude level of a signal to drive the P-type transistor P1 is extended to a negative side and a second level shifter (level shifter LEVN) by which an amplitude level of a signal to drive the N-type transistor N1 is extended to a positive side.

According to the aforementioned configuration, an amplitude level of a signal to drive a P-type transistor is extended to a negative side and an amplitude level of a signal to drive an N-type transistor is extended to a positive side. Thus, a current flowing in the P-type transistor is increased and a current flowing in the N-type transistor is increased. As a result, it is possible to enhance a driving ability of a P-type transistor and an N-type transistor of an output buffer circuit without adding a process optimized exclusively for the output buffer.

In the level shift circuit 1 according to an aspect 3 of the disclosure, in the aspect 2, based on one of grayscale voltages generated by the grayscale voltage generating circuit 6 that generates a grayscale voltage for the display apparatus 101, the first level shifter (level shifter LEVP) may extend the amplitude level of the signal to drive the P-type transistor P1 to the negative side.

According to the aforementioned configuration, it is possible to extend an amplitude level of a signal to drive a P-type transistor to a negative side by using a grayscale voltage required for a display apparatus.

In the level shift circuit 1 according to an aspect 4 of the disclosure, in the aspect 2, a voltage of the negative side, which is extended by the first level shifter (level shifter LEVP), may not exceed breakdown voltage of the P-type transistor P1.

According to the aforementioned configuration, it is possible to avoid damage to a P-type transistor by extension of an amplitude level of a signal to drive the P-type transistor.

In the level shift circuit 1 according to an aspect 5 of the disclosure, in the aspect 2, based on a power source voltage supplied to the grayscale voltage generating circuit 6 that generates a grayscale voltage for the display apparatus 101, the second level shifter (level shifter LEVN) may extend the amplitude level of the signal to drive the N-type transistor N1 to the positive side.

According to the aforementioned configuration, it is possible to extend an amplitude level of a signal to drive an N-type transistor to a positive side by using a power source voltage required for a display apparatus.

In the level shift circuit 1 according to an aspect 6 of the disclosure, in the aspect 2, a voltage of the positive side, which is extended by the second level shifter (level shifter LEVN), may not exceed breakdown voltage of the N-type transistor N1.

According to the aforementioned configuration, it is possible to avoid damage to an N-type transistor by extension of an amplitude level of a signal to drive the N-type transistor.

A display driver integrated circuit according to an aspect 7 of the disclosure includes: the level shift circuit described in the aspect 3 or 5; and the source drive circuit 7 that drives a display apparatus based on a grayscale voltage generated by the grayscale voltage generating circuit 6.

The disclosure is not limited to each of embodiments described above and may be modified in various manners within the scope of the claims. An embodiment achieved by appropriately combining techniques disclosed in each of different embodiments is also encompassed in the technical scope of the disclosure. Further, by combining techniques disclosed in each of the embodiments, a new technical feature may be formed.

The present disclosure contains subject matter related to that disclosed in Japanese Priority Patent Application JP 2017-228286 filed in the Japan Patent Office on Nov. 28, 2017, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A level shift circuit comprising:
    a level shifter circuit by which a level of a logic signal is shifted; and
    an output buffer circuit including a P-type transistor and an N-type transistor that output a signal, a positive-side power source being connected to the P-type transistor and having voltage higher than a higher end level of electric potential of the logic signal, and a negative-side power source being connected to the N-type transistor and having voltage lower than or equal to a lower end level of electric potential of the logic signal, wherein
    the level shifter circuit includes a first level shifter portion that outputs a gate signal level to the P-type transistor and a second level shifter portion that outputs a gate signal level to the N-type transistor,
    the first level shifter portion is connected to a first positive-side power source and a first negative-side power source, the first positive-side power source having voltage equal to the voltage of the positive-side power source connected to the P-type transistor, the first negative-side power source having voltage lower than the voltage of the negative-side power source connected to the N-type transistor,
    the second level shifter portion is connected to a second positive-side power source and a second negative-side power source, the second positive-side power source having voltage higher than the voltage of the positive-side power source connected to the P-type transistor, the second negative-side power source having voltage equal to the voltage of the negative-side connected to the N-type transistor,
    when the logic signal input to the level shift circuit is at the higher end level, the first level shifter portion shifts the level of the logic signal to the gate signal level having an electric potential corresponding to the voltage of the first negative-side power source and outputs the gate signal level that turns on the P-type transistor, and the second level shifter portion shifts the level of the logic signal to the gate signal level having an electric potential corresponding to the voltage of the second negative-side power source and outputs the gate signal level that turns off the N-type transistor, and
    when the logic signal input to the level shift circuit is at the lower end level, the first level shifter portion shifts the level of the logic signal to the gate signal level having an electric potential corresponding to the voltage of the first positive-side power source and outputs the gate signal level that turns off the P-type transistor, and the second level shifter portion shifts the level of the logic signal to the gate signal level having an electric potential corresponding to the voltage of the second positive-side power source and outputs the gate signal level that turns on the N-type transistor.

2. The level shift circuit according to claim 1, wherein, based on one of grayscale voltages generated by a grayscale voltage generating circuit that generates a grayscale voltage for a display apparatus, the first level shifter portion shifts the level of the logic signal to the gate signal level having the electric potential corresponding to the voltage of the first negative-side power source and outputs the gate signal level that turns on the P-type transistor.

3. A display driver integrated circuit comprising:
    the level shift circuit according to claim 2; and
    a source drive circuit that drives a display apparatus based on a grayscale voltage generated by the grayscale voltage generating circuit.

4. The level shift circuit according to claim 1, wherein the gate signal level having the electric potential corresponding to the voltage of the first negative-side power source, which is shifted by the first level shifter portion, does not exceed breakdown voltage of the P-type transistor.

5. The level shift circuit according to claim 1, wherein, based on a power source voltage supplied to a grayscale voltage generating circuit that generates a grayscale voltage for a display apparatus, the second level shifter portion shifts the level of the logic signal to the gate signal level having the electric potential corresponding to the voltage of the second positive-side power source and outputs the gate signal level that turns on the N-type transistor.

6. A display driver integrated circuit comprising:
   the level shift circuit according to claim 5; and
   a source drive circuit that drives a display apparatus based on a grayscale voltage generated by the grayscale voltage generating circuit.

7. The level shift circuit according to claim 1, wherein the gate signal level having the electric potential corresponding to the voltage of the second positive-side power source, which is shifted by the second level shifter portion, does not exceed breakdown voltage of the N-type transistor.

8. A display device driver comprising the level shift circuit according to claim 1.

9. The level shift circuit according to claim 1, wherein
   a range of the gate signal level output by the first level shifter portion is between the voltage of the first positive-side power source and the voltage of the first negative-side power source that is lower than the voltage of the negative-side power source connected to the N-type transistor, and
   a range of the gate signal level output by the second level shifter portion is between the voltage of the second negative-side power source and the voltage of the second positive-side power source that is higher than the voltage of the positive-side power source connected to the P-type transistor.

\* \* \* \* \*